(12) United States Patent
Singer et al.

(10) Patent No.: US 11,594,858 B2
(45) Date of Patent: *Feb. 28, 2023

(54) OPTICAL RESONATOR WITH LOCALIZED ION-IMPLANTED VOIDS

(71) Applicant: GM Cruise Holdings LLC, San Francisco, CA (US)

(72) Inventors: Scott Singer, San Gabriel, CA (US); Lutfollah Maleki, Pasadena, CA (US); Ivan Grudinin, South Pasadena, CA (US); Sergio Alvarez, Pico Rivera, CA (US); Vladimir Ilchenko, Arcadia, CA (US)

(73) Assignee: GM CRUISE HOLDINGS LLC, San Francisco, CA (US)

( * ) Notice: Subject to any disclaimer, the term of this patent is extended or adjusted under 35 U.S.C. 154(b) by 2 days.

This patent is subject to a terminal disclaimer.

(21) Appl. No.: 17/363,675

(22) Filed: Jun. 30, 2021

(65) Prior Publication Data

US 2021/0328405 A1 Oct. 21, 2021

Related U.S. Application Data

(63) Continuation of application No. 16/589,006, filed on Sep. 30, 2019, now Pat. No. 11,081,859.

(51) Int. Cl.
*H01S 5/10* (2021.01)
*G01S 17/34* (2020.01)

(52) U.S. Cl.
CPC ............ *H01S 5/1017* (2013.01); *G01S 17/34* (2020.01); *H01S 5/1075* (2013.01)

(58) Field of Classification Search
CPC ....... G01S 17/34; H01S 5/1075; H01S 5/1017
(Continued)

(56) References Cited

U.S. PATENT DOCUMENTS 5,343,490 A * 8/1994 McCall ............. G02B 6/29341
372/67
7,173,749 B2 2/2007 Maleki et al.
(Continued)

FOREIGN PATENT DOCUMENTS

WO 2015137945 A1 9/2015
WO 2021066866 A1 4/2021

OTHER PUBLICATIONS

"International Search Report for PCT Patent Application No. PCT/US2019/068846", dated Jun. 4, 2020, 4 Pages.
(Continued)

*Primary Examiner* — Tuan N Nguyen
(74) *Attorney, Agent, or Firm* — Calfee, Halter & Griswold LLP

(57) ABSTRACT

A high Q whispering gallery mode resonator with ion-implanted voids is described. A resonator device includes a resonator disk formed of an electrooptic material. The resonator disk includes a top surface, a bottom surface substantially parallel to the top surface, and a side structure between the top surface and the bottom surface. The side structure includes an axial surface along a perimeter of the resonator disk, where a midplane passes through the axial surface dividing the axial surface into symmetrical halves. The whispering gallery mode resonator disk includes voids localized at a particular depth from the top surface. At least one of the voids localized at the particular depth from the top surface is located at an outer extremity towards the perimeter of the resonator disk. The resonator device can further include a first electrode on the top surface and a second electrode on the bottom surface.

20 Claims, 7 Drawing Sheets

(58) Field of Classification Search
USPC .................................................. 372/45.01
See application file for complete search history.

(56) References Cited

U.S. PATENT DOCUMENTS

| | | | |
|---|---|---|---|
| 11,081,859 | B2 | 8/2021 | Singer et al. |
| 2004/0179573 | A1 | 9/2004 | Armani et al. |
| 2005/0128566 | A1 | 6/2005 | Savchenkov et al. |
| 2005/0169331 | A1* | 8/2005 | Vahala .................. H01S 3/0604 372/66 |
| 2016/0131844 | A1* | 5/2016 | Yang .................... H01S 3/1608 359/345 |
| 2018/0306696 | A1* | 10/2018 | Ozdemir ............ G01N 21/7746 |
| 2019/0146091 | A1* | 5/2019 | Matsko .................. H01S 5/141 356/5.01 |
| 2021/0098968 | A1 | 4/2021 | Singer et al. |

OTHER PUBLICATIONS

"Written Opinion of the International Searching Authority for PCT Patent Application No. PCT/US2019/068846", dated Jun. 4, 2020, 8 Pages.

"Non-Final Office Action for U.S. Appl. No. 16/589,006", dated Mar. 3, 2021, 9 Pages.

"Reply to Non-Final Office Action for U.S. Appl. No. 16/589,006", dated May 24, 2021, 11 Pages.

"Notice of Allowance and Fees Due for U.S. Appl. No. 16/589,006", dated Jun. 14, 2021, 3 Pages.

"Communication Pursuant to Rules 161(1) and 162 EPC for European Patent Application No. 19845804.4", dated Mar. 18, 2022, 3 pages.

"International Preliminary Report on Patentability for PCT Patent Application No. PCT/US2019/068846", dated Apr. 5, 2022, 9 pages.

"Response to Communication Pursuant to Rules 161(1) and 162 EPC for European Patent Application No. 19845804.4", dated Sep. 28, 2022, 29 pages.

"Request for Examination for Japanese Patent Application No. 2022-519741", Filed Date: Sep. 27, 2022, 2 pages.

"Request for Substantive Examination for Chinese Patent Application No. 201980100992.6", Filed Date: Aug. 18, 2022, 5 pages.

"Voluntary Amendment for Chinese Patent Application No. 201980100992.6", Filed Date: Aug. 18, 2022, 17 pages.

\* cited by examiner

OPTICAL RESONATOR WITH LOCALIZED ION-IMPLANTED VOIDS

CROSS-REFERENCE TO RELATED APPLICATION

This application is a continuation of U.S. patent application Ser. No. 16/589,006, filed on Sep. 30, 2019, and entitled "OPTICAL RESONATOR WITH LOCALIZED ION-IMPLANTED VOIDS", the entirety of which is incorporated herein by reference.

BACKGROUND

Various conventional architectures employ a laser that is injection locked to a resonator. For instance, the laser can emit a light beam that is sent to the resonator. The laser and the resonator are optically coupled, such that the light beam from the laser is provided to the resonator, circulates inside the resonator undergoing total internal reflection, and is provided back from the resonator to the laser. When injection locked, the frequency of the laser is a slave to the frequency of the resonator (e.g., the resonator can cause the laser to emit a light beam at substantially similar frequency as compared to the frequency of the resonator).

An exemplary resonator that can be utilized for injection locking is a high quality factor (Q) whispering gallery mode resonator. Due to electrooptic properties and size of such a resonator, frequency of a whispering gallery mode resonator can be linearly modulated with a relatively narrow linewidth. According to an example, a voltage in a sawtooth waveform applied to the resonator can cause the laser injection locked to the resonator to emit a light beam with a frequency that follows the sawtooth waveform.

Conventional whispering gallery mode resonators can intrinsically support a plurality of modes per each free spectral range (FSR). Mode positions in the traditional resonators can be determined by resonator geometry, which can have variations due to limited fabrication precision. Accordingly, many fabricated resonators can have side modes near a working mode (e.g., within a certain frequency range), which can render such resonators unusable. Thus, resonator production yield for conventional resonators can be detrimentally impacted.

SUMMARY

The following is a brief summary of subject matter that is described in greater detail herein. This summary is not intended to be limiting as to the scope of the claims.

Described herein are various technologies that pertain to high Q whispering gallery mode resonators with ion-implanted voids. A whispering gallery mode resonator device can include a whispering gallery mode resonator disk formed of an electrooptic material. The whispering gallery mode resonator disk can include a top surface, a bottom surface substantially parallel to the top surface, and a side structure between the top surface and the bottom surface. The side structure can include an axial surface along a perimeter of the whispering gallery mode resonator disk, where a midplane passes through the axial surface dividing the axial surface into symmetrical halves. Moreover, the whispering gallery mode resonator disk includes voids localized at a particular depth from the top surface. At least one of the voids localized at the particular depth from the top surface is located at an outer extremity towards the perimeter of the whispering gallery mode resonator disk. The whispering gallery mode resonator device can further include a first electrode on the top surface of the whispering gallery mode resonator disk and a second electrode on the bottom surface of the whispering gallery mode resonator disk.

Voids can be formed in the whispering gallery mode resonator disk via ion implantation. According to various embodiments, an ion beam can be directed at a top surface of a wafer formed of an electrooptic material such that ions in the ion beam are implanted in the wafer and form voids distributed at a particular depth from the top surface of the wafer. Subsequent to the voids being formed in the wafer, the wafer with the voids distributed at the particular depth from the top surface can be cut to produce whispering gallery mode resonator devices. Void(s) located at an outer extremity towards a perimeter of a whispering gallery mode resonator device can suppress side mode(s) due to differences in refractive index. Moreover, performing ion implantation to generate voids in the wafer prior to cutting resonator devices from the wafer enables defects to be created for the resonator devices in a parallel manner, which aides mass production of whispering gallery mode resonator devices with localized voids to suppress side modes.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
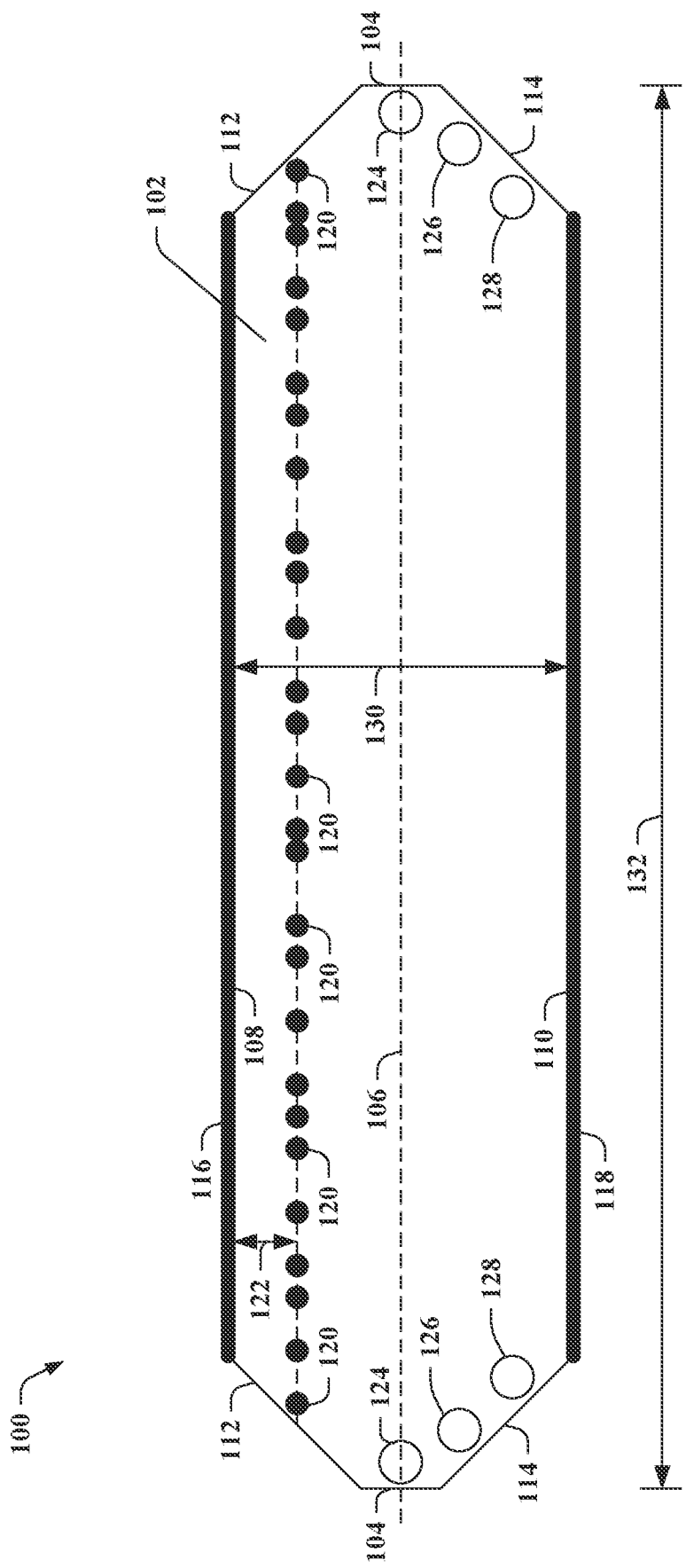
FIG. 1 illustrates a cross-sectional view of an exemplary whispering gallery mode resonator device that includes localized ion-implanted voids.

Various technologies pertaining to optical resonators with localized ion-implanted voids are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

As used herein, the terms "component" and "system" are intended to encompass computer-readable data storage that is configured with computer-executable instructions that cause certain functionality to be performed when executed by a processor. The computer-executable instructions may include a routine, a function, or the like. The terms "component" and "system" are also intended to encompass one or more optical elements that can be configured or coupled together to perform various functionality with respect to an optical signal. It is also to be understood that a component or system may be localized on a single device or distributed across several devices. Further, as used herein, the term "exemplary" is intended to mean "serving as an illustration or example of something."

Referring now to the drawings, FIG. 1 illustrates a cross-sectional view of an exemplary whispering gallery mode resonator device 100 that includes localized ion-implanted voids (also referred to herein as a resonator device 100). As used herein, the terms "resonator device" and "resonator" are used interchangeably. The resonator device 100 includes a whispering gallery mode resonator disk 102 (also referred to herein as a resonator disk 102) formed of an electrooptic material. For example, the whispering gallery mode resonator disk 102 can be formed of any of various crystalline materials such as calcium fluoride, magnesium fluoride, lithium niobate, lithium tantalate, silicon, or the like.

The whispering gallery mode resonator disk 102 includes an axial surface 104 along a perimeter of the whispering gallery mode resonator disk 102. A midplane 106 passes through the axial surface 104 dividing the axial surface 104 into symmetrical halves. Thus, as shown, a top half of the axial surface 104 is above the first midplane 106 and a bottom half of the axial surface 104 is below the first midplane 106. The whispering gallery mode resonator disk 102 further includes a top surface 108 and a bottom surface 110. The bottom surface 110 is substantially parallel to the top surface 108. Thus, in the example of FIG. 1, the midplane 106 is substantially equidistant between the top surface 108 and the bottom surface 110.

According to various examples, the whispering gallery mode resonator disk 102 can also include a first chamfered edge 112 and a second chamfered edge 114. The first chamfered edge 112 is between the top surface 108 and the axial surface 104, and the second chamfered edge 114 is between the bottom surface 110 and the axial surface 104. Further, the axial surface 104, the first chamfered edge 112, and the second chamfered edge 114 can form a convex side structure of the whispering gallery mode resonator disk 102 (e.g., the axial surface 104, the first chamfered edge 112, and the second chamfered edge have a convex geometry from a point of view external to the resonator device 100). The convex side structure of the whispering gallery mode resonator disk 102 can simplify fabrication, polishing, cleaning, etc. of the resonator device 100 (as opposed to a concave side structure). In accordance with other examples, it is contemplated that the whispering gallery mode resonator disk 102 can lack the first chamfered edge 112 and the second chamfered edge 114 (e.g., the axial surface 104 can extend between the top surface 108 and the bottom surface 110).

The resonator device 100 further includes a first electrode 116 on the top surface 108 of the whispering gallery mode resonator disk 102 and a second electrode 118 on the bottom surface 110 of the whispering gallery mode resonator disk 102. Substantially any type of electrodes 116-118 can be on the top and bottom surfaces 108-110 of the whispering gallery mode resonator disk 102. According to an illustration, an optical insulator can be adjacent to the electrooptic material of the whispering gallery mode resonator disk 102. Further, a layer of a bonding metal, such as chromium or titanium, can be on the optical insulator, and the electrode can be on the bonding metal. Following this illustration, an optical insulator layer and a bonding metal layer can be between the top surface 108 and the first electrode 116. Likewise, an optical insulator layer and a bonding metal layer can be between the bottom surface 110 and the second electrode 118. However, it is to be appreciated that the claimed subject matter is not limited to the foregoing illustration. Moreover, according to an example, the electrodes 116-118 can be formed of gold; yet, it is contemplated that the electrodes 116-118 can be formed of other materials.

The whispering gallery mode resonator disk 102 further includes voids 120 localized at a depth 122 from the top surface 108. The voids 120 are defects in the whispering gallery mode resonator disk 102. The voids 120 have a different index of refraction compared to a remainder of the whispering gallery mode resonator disk 102. Due to the difference in index of refraction, the voids 120 can suppress side mode(s) at locations of the voids 120 in the whispering gallery mode resonator disk 102. Thus, one of more of the voids 120 that are located at an outer extremity towards the perimeter of the whispering gallery mode resonator disk 102 at the depth 122 from the top surface 108 can suppress side mode(s) at the outer extremity towards the perimeter within vicinity of the depth 122 from the top surface 108. As depicted in FIG. 1, two of the voids 120 are located at or near the first chamfered edge 112. These two voids 120 can suppress side mode(s) at or near the first chamfered edge 112 within vicinity of the depth 122 from the top surface 108 in the whispering gallery mode resonator disk 102.

An optical whispering gallery mode resonator device can have a set of optical mode families that it supports. Frequencies of modes in each family can be determined by material properties. Further, the set of mode families can be determined by a shape of the whispering gallery mode resonator device. The whispering gallery mode resonator device 100 can support a fundamental mode 124 located in the midplane 106. A fundamental mode can also be referred to as a lidar working mode (if the whispering gallery mode resonator device 100 is utilized as part of a lidar sensor system). The fundamental mode 124 in the midplane 106 is located at an outer extremity towards the perimeter of the whispering gallery mode resonator disk 102 (e.g., towards the axial surface 104 in the midplane 106).

Moreover, side modes (also referred to as higher order modes) can be located progressively away from a location of a fundamental mode in a whispering gallery mode resonator device. Side modes can exist in vicinity of the fundamental mode, resulting in dense resonator spectrum. The side modes can include transverse and radial modes. Transverse modes can extend in an axial (e.g., up and down) direction from the location of the fundamental mode, and radial modes can extend in the radial direction from the location of the fundamental mode towards the center of a resonator device. A side mode 126 and a side mode 128 are depicted in FIG. 1 for purposes of illustration. It is contemplated that the claimed subject matter is not limited to the resonator device 100 including two side modes.

According to various embodiments, a thickness 130 of the whispering gallery mode resonator disk 102 can be in a range between 40 and 60 micrometers. As described herein, ranges can be inclusive ranges; thus, 40 and 60 micrometers are intended to fall within the scope of the aforementioned range. According to an example, the thickness 130 of the whispering gallery mode resonator disk 102 can be 50 micrometers. A distance between the top surface 108 and the midplane 106 can be half the thickness 130 of the whispering gallery mode resonator disk 102, and a distance between the bottom surface 110 and the midplane 106 can be half the thickness 130 of the whispering gallery mode resonator disk 102. Moreover, the depth 122 from the top surface 108 of the voids 120 can be in a range between 10 and 20 micrometers; the depth 122 of the voids 120 is offset from the midplane 106 so one or more of the voids 120 do not suppress the fundamental mode 124. Further, a diameter 132 of the whispering gallery mode resonator disk 102 can be in a range between 1.2 and 1.4 millimeters. Pursuant to an example, the diameter 132 of the whispering gallery mode resonator disk 102 can be 1.3 millimeters. However, it is to be appreciated that differing thicknesses 130, diameters 132, and depths 122 are intended to fall within the scope of the hereto appended claims, as the approaches set forth herein are scalable to other thicknesses 130 (e.g., outside of the 40 to 60 micrometer range), other diameters 132 (e.g., outside of the 1.2 to 1.4 millimeter range), and other depths (e.g., outside of the 10 to 20 micrometer range).

As depicted in FIG. 1, the number of side modes with a large axial extent (e.g., along a disk axis, up and down) can be lowered (compared to a symmetric whispering gallery mode resonator device lacking voids) by including the voids 120 at the depth 122 from the top surface 108. Thus, in the example of FIG. 1, side mode(s) (e.g., transverse mode(s) with high axial extent) between the midplane 106 and the top surface 108 (or at least a subset of such side modes) can be suppressed due to the index of refraction difference between the voids 120 and the material from which the whispering gallery mode resonator disk 102 is formed, while the fundamental mode 124 can remain relatively unaffected (since light of the fundamental mode 124 does not propagate through a void).

While many of the examples set forth herein describe a disk-shaped resonator (e.g., the resonator disk 102), it is contemplated that other resonator shapes are intended to fall within the scope of the hereto appended claims. For instance, the resonator device 100 can alternatively include a resonator ring or an asymmetrical resonator disk. Voids can be located in the resonator ring or the asymmetrical resonator disk (or a resonator formed in a differing shape) in manners similar to the examples set forth herein so as to suppress side mode(s).

Figure 2:
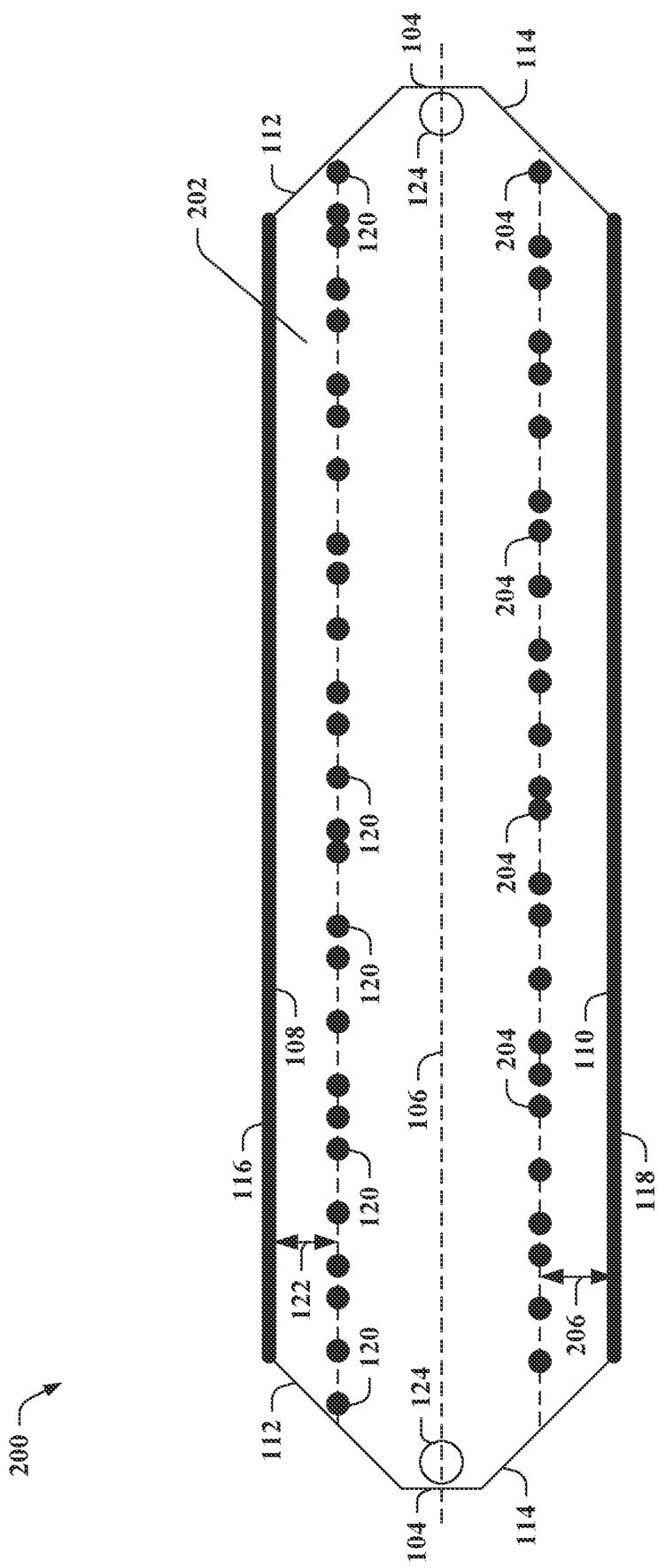
FIG. 2 illustrates a cross-sectional view of another exemplary whispering gallery mode resonator device that includes localized ion-implanted voids.

Now turning to FIG. 2, illustrated is a cross-sectional view of another exemplary whispering gallery mode resonator device 200 that includes localized ion-implanted voids (resonator device 200). Similar to the resonator device 100 of FIG. 1, the resonator device 200 includes a whispering gallery mode resonator disk 202 formed of an electrooptic material. The whispering gallery mode resonator disk 202 again includes the axial surface 104 along the perimeter, where the midplane 106 passes through the axial surface 104 dividing the axial surface 204 into symmetrical halves. The whispering gallery mode resonator disk 202 further includes the top surface 108, the bottom surface 110, the first chamfered edge 112, and the second chamfered edge 114; although, it is contemplated in other embodiments that the whispering gallery mode resonator disk 202 need not include the first chamfered edge 112 and the second chamfered edge 114.

The whispering gallery mode resonator device 200 also includes the first electrode 116 and the second electrode 118. The first electrode 116 is on the top surface 108 of the whispering gallery mode resonator disk 202. Moreover, the second electrode 118 is on the bottom surface 110 of the whispering gallery mode resonator disk 202.

Similar to the resonator device 100 of FIG. 1, the whispering gallery mode resonator disk 202 includes the voids 120 localized at the depth 122 from the top surface 108. Moreover, the whispering gallery mode resonator disk 202 includes voids 204 localized at a depth 206 from the bottom surface 110. According to an example, the depth 122 of the voids 120 can be substantially similar to the depth 206 of the voids 204; however, it is contemplated that the voids 120 and the voids 204 can be at differing depths 122 and 204 from the respective surfaces 108 and 110. One or more of the voids 120 that are located at an outer extremity towards the perimeter of the whispering gallery mode resonator disk 202 at the depth 122 from the top surface can suppress side mode(s) at the outer extremity towards the perimeter within vicinity of the depth 122 from the top surface 108. Likewise, one or more of the voids 204 that are located at an outer extremity towards the perimeter of the whispering gallery mode resonator disk 202 at the depth 206 from the bottom surface 110 can suppress side mode(s) at the outer extremity towards the perimeter within vicinity of the depth 206 from the bottom surface 110. In the depicted example, two of the voids 120 are located at or near the first chamfered edge 112, and one of the voids 204 is located at or near the second chamfered edge 114; these voids can suppress side mode as described herein.

The whispering gallery mode resonator device 200 can support the fundamental mode 124 located in the midplane 106. Further, although not shown, side mode(s) can be located progressively away from a location of the fundamental mode 124 in the resonator device 200 (e.g., not all side modes may be suppressed by the voids 120 and the voids 204).

Similar to the resonator device 100 of FIG. 1, the resonator device 200 of FIG. 2 can reduce the number of side modes with large axial extent (e.g., along the disk axis, up and down) as compared to a whispering gallery mode resonator device that lacks voids. In the example of FIG. 2, side mode(s) (e.g., transverse mode(s) with high axial extent) between the midplane 106 and the top surface 108 (or at least a subset of such side modes) can be suppressed due to the index of refraction differences between the voids 120 and the material from the which the whispering gallery mode resonator disk 202 is formed. Likewise, side mode(s) (e.g., transverse mode(s) with high axial extent) between the midplane 106 and the bottom surface 110 (or at least a subset of such side modes) can be suppressed due to the index of refraction differences between the voids 204 and the material from which the whispering gallery mode resonator disk 202 is formed. Moreover, the fundamental mode 124 can remain relatively unaffected (since light of the fundamental mode 124 does not propagate through a void).

While FIGS. 1-2 describe voids being at a particular depth from the top surface 108 or the bottom surface 110, it is contemplated that the voids can be within a range of depths from the top surface 108 or the bottom surface 110. For example, the voids 120 can be within a depth range that is 10 micrometers to 15 micrometers from the top surface 108; however, the claimed subject matter is not limited to the foregoing example. According to other embodiments, voids can be localized at more than one depth from the top surface 108 or the bottom surface. By way of example, a first set of voids can be localized at a depth of 10 micrometers from the top surface 108 and a second set of voids can be localized at a depth of 15 micrometers from the top surface 108; again, it is to be appreciated that the claimed subject matter is not limited to this example.

Figure 3:
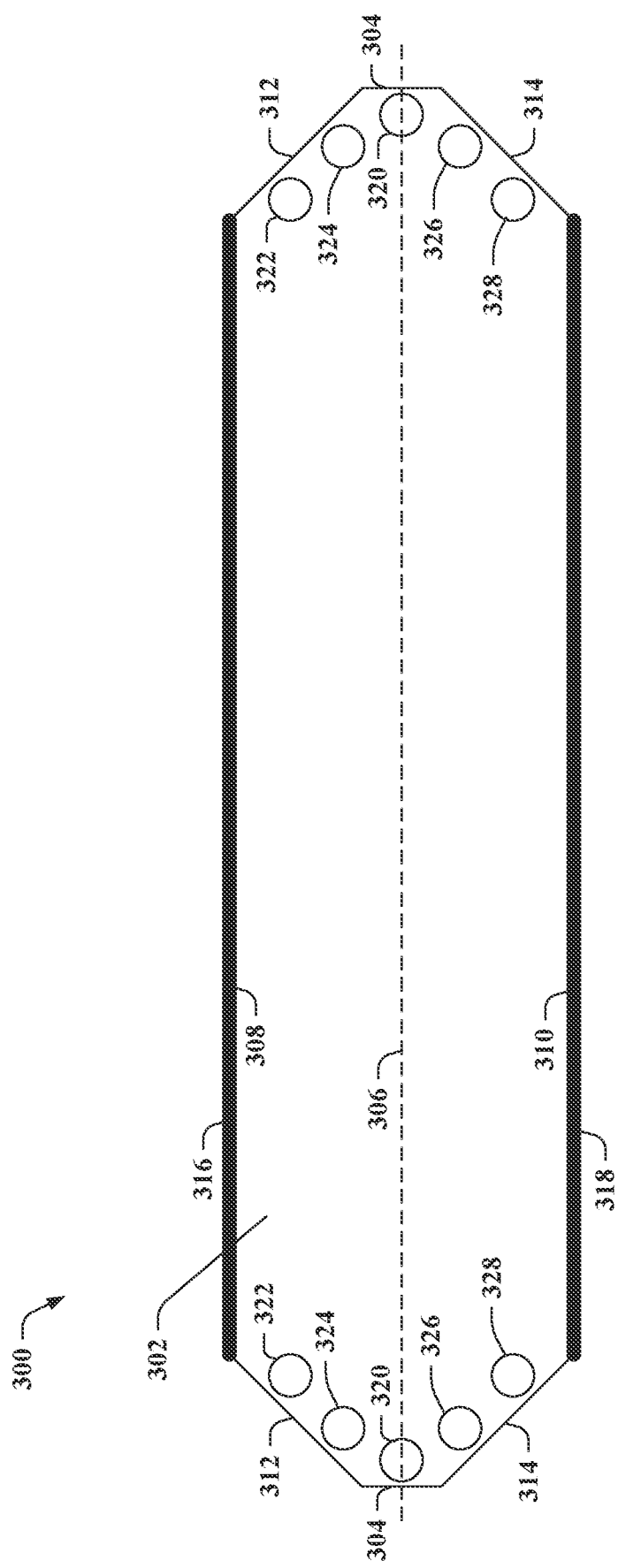
FIG. 3 illustrates a cross-sectional view of an exemplary whispering gallery mode resonator device that lacks voids.

Referring to FIG. 3, illustrated is a cross-sectional view of an exemplary whispering gallery mode resonator device 300 (resonator device 300) that lacks voids. The resonator device 300 includes a whispering gallery mode resonator disk 302 (resonator disk 302) formed of an electrooptic material. The whispering gallery mode resonator disk 302 includes an axial surface 304 along a perimeter, where a midplane 306 passes through the axial surface 304 dividing the axial surface 304 into symmetrical halves.

The whispering gallery mode resonator disk 302 also includes a top surface 308, a bottom surface 310, a first chamfered edge 312, and a second chamfered edge 314. The midplane 306 is also substantially equidistant between the top surface 308 and the bottom surface 310. The whispering gallery mode resonator device 300 also includes a first electrode 316 on the top surface 308 and a second electrode 318 on the bottom surface 310.

The whispering gallery mode resonator device 300 supports a fundamental mode 320 in the midplane 306 of the resonator device 300. Side modes can be located progressively away from the fundamental mode 320 in the midplane 306 of the resonator disk 302. In the example shown in FIG. 3, four side modes (e.g., a side mode 322, a side mode 324, a side mode 326, and a side mode 328) are located in vicinity of the fundamental mode 320; yet, it is contemplated that more or less than four side modes can be located near a perimeter of the whispering gallery mode resonator disk 302. As described above, the whispering gallery mode resonator device 100 of FIG. 1 and the whispering gallery mode resonator device 200 of FIG. 2 can reduce the number of side modes relative to the whispering gallery mode resonator device 300 shown in FIG. 3 (e.g., by having voids that suppress side modes located within the whispering gallery mode resonator disk).

Figure 4:
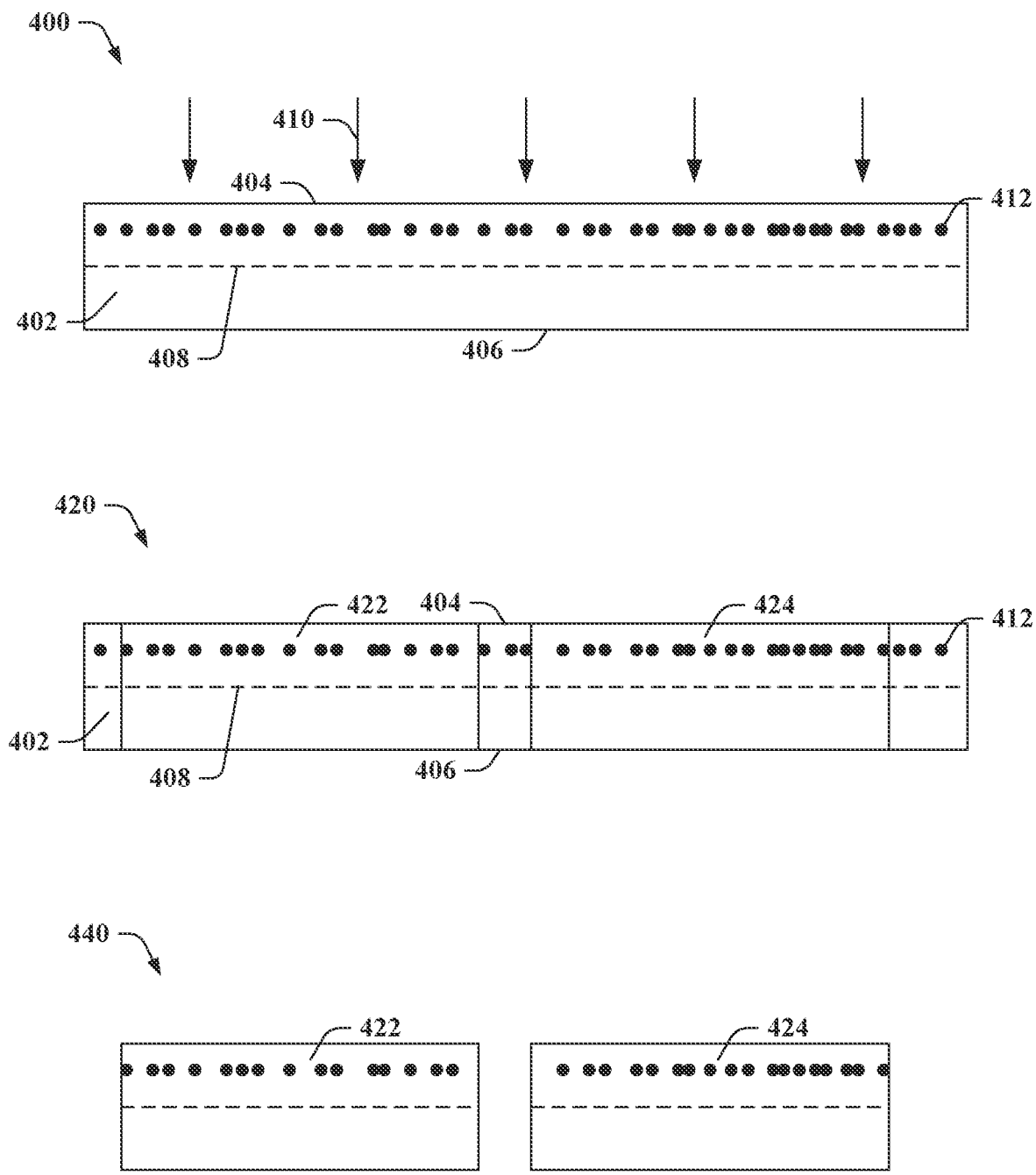
FIG. 4 illustrates an exemplary technique for manufacturing a whispering gallery mode resonator device with localized voids.

With reference to FIG. 4, illustrated is an exemplary technique for manufacturing a whispering gallery mode resonator device with localized voids (e.g., the whispering gallery mode resonator device 100). A first stage of the technique is depicted at 400, where a wafer 402 having a top surface 404, a bottom surface 406, and a midplane 408 is depicted. The wafer 402 can be formed of a crystalline material such as calcium fluoride, magnesium fluoride, lithium niobate, lithium tantalate, silicon, or the like. An ion beam 410 is directed at the top surface 404 of the wafer 402; thus, the wafer 402 is subjected to bombardment of ions of the ion beam 410 through the top surface 404. The ions are implanted in the wafer 402 and form voids 412 (e.g., defects) distributed at a depth from the top surface 404 (e.g., the depth 122 of the voids 120 described above). For example, the implanted ions can form bubbles (e.g., the voids 412), which are distributed in vicinity of a plane substantially parallel to the top surface 404 within the wafer 402. Pursuant to various embodiments, hydrogen ions (H+ ions) can be implanted in the wafer 402 to form the voids 412; yet, it is contemplated that other ions can additionally or alternatively be implanted in the wafer 402.

Implantation energy and ion current density of the ion beam 410 bombarding the top surface 404 of the wafer 402 can be tuned to create a desired density of the voids 412 at a desired depth (or depths) from the top surface 404. The density of the voids 412 formed in the wafer 402 is controlled such that resonator devices cored out of the wafer 402 each include at least one of the voids 412 at or near respective perimeters of the resonator devices with a probability above a threshold (e.g., 99%, 99.9%, 99.99%). Thus, the density of the voids 412 in the material of the wafer 402 at a calibrated depth from the top surface 404 can be generated prior to fabrication of resonator devices; the calibrated depth from the top surface 404 can suppress side modes in favor of fundamental modes in the resonator devices fabricated from the wafer 402.

A second stage of the technique is depicted at 420, where resonator devices are cut from the wafer 402. The resonator devices that are produced are depicted at 440 (e.g., the resonator devices are separated from the remainder of the wafer 402 at 440). For purposes of simplicity, two resonator devices 422 and 424 are depicted in FIG. 4; yet, it is contemplated that substantially any number of resonator devices can be cut from the wafer 402. The density of the voids 412 in the wafer 402 is such that locations at which the resonator devices are cut from the wafer 402 need not be precisely controlled (e.g., a probably of at least one void being at or near a perimeter of a resonator device is above the threshold regardless where the wafer 402 is cut to form the resonator device).

Moreover, although not shown, it is to be appreciated that additional fabrication steps can be performed on the wafer 402 subsequent to ion implantation and prior to the resonator devices being cut. For example, layers can be added to the top surface 404 and the bottom surface 406 of the wafer 402; such layers can form electrodes of the resulting resonator devices.

The resonator devices 422 and 424 that are depicted in FIG. 4 are disk shaped resonator devices that lack chamfered edges. It is to be appreciated that resonator devices having other shapes can alternatively be cut from the wafer 402 (e.g., the resonator devices can be disk shaped with chamfered edges, the resonator devices can be asymmetric disk shaped, the resonator devices can be ring shaped); accordingly, the claimed subject matter is not limited to the example depicted in FIG. 4. Moreover, although not shown, it is contemplated that additional fabrication steps can be performed on the resonator devices 422 and 424 subsequent to cutting (e.g., side structures of the resonator devices 422 and 424 can be polished, cleaned, etc.).

According to an example, the resonator device 422 (and similarly the other resonator devices fabricated from the wafer 402) can support a fundamental mode in the midplane 408, while a void at or near a perimeter of the resonator device 422 can suppress side mode(s) in the resonator device 422. Performance of ion implantation to generate the voids 412 in the wafer 402 prior to cutting the resonator devices from the wafer 402 enables defects to be created for the resonator devices in a parallel manner, which aides mass production of whispering gallery mode resonator devices with localized voids to suppress side modes.

Figure 5:
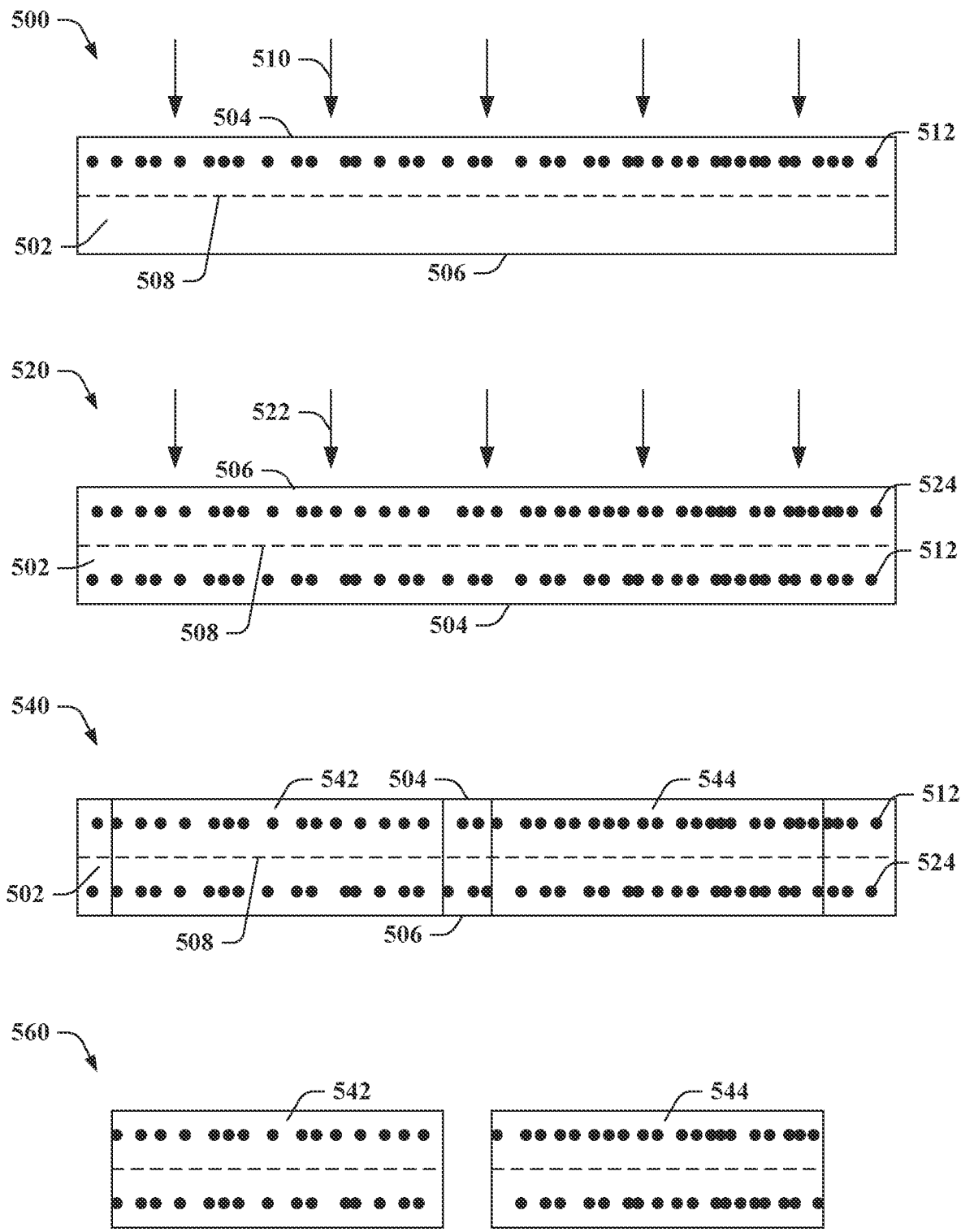
FIG. 5 illustrates another exemplary technique for manufacturing a whispering gallery mode resonator device with localized voids.

Now referring to FIG. 5, illustrated is another exemplary technique for manufacturing a whispering gallery mode resonator device with localized voids (e.g., the whispering gallery mode resonator device 200). A first stage of the technique is shown at 500; again, a wafer 502 includes a top surface 504, a bottom surface 506, and a midplane 508. Similar to above, an ion beam 510 is directed at the top surface 504 of the wafer 502. Accordingly, ions of the ion beam 510 are implanted in the wafer 502 and form voids 512 distributed at a depth from the top surface 504 (e.g., the depth 122 of the voids 122 described above). As set forth above, implantation energy and ion current density of the ion beam 510 bombarding the top surface 504 of the wafer 502 can be tuned to create a desired density of the voids 512 at a desired depth (or depths) from the top surface 504 (e.g., the density of the voids 512 formed in the wafer 502 is controlled such that resonator devices cored out of the wafer 502 each include at least one of the voids 512 at or near respective perimeters of the resonator devices with a probability above the threshold).

A second stage of the technique is depicted at 520. An ion beam 522 is directed at the bottom surface 506 of the wafer 502 (e.g., the wafer 502 can be flipped as depicted in FIG. 5 at 520). The ion beam 522 can be substantially similar to the ion beam 510 (e.g., substantially similar ions can be implanted, implantation energy can be substantially similar, ion current density can be substantially similar); however, the claimed subject matter is not so limited. Ions of the ion beam 522 are implanted in the wafer 502 and form voids 524 distributed at a depth from the bottom surface 506 (e.g., the depth 206 of the voids 204). Similar to above, implantation energy and ion current density of the ion beam 522 bombarding the bottom surface 506 of the wafer 502 can be tuned to create a desired density of the voids 524 at a desired depth (or depths) from the bottom surface 506 (e.g., the density of the voids 524 formed in the wafer 502 is controlled such that resonator devices cored out of the wafer 502 each include at least one of the voids 524 at or near respective perimeters of the resonator devices with a probability above the threshold).

A third stage of the technique is depicted at 540, where resonator devices are cut from the wafer 502. The resonator devices that are produced are shown at 560 (e.g., the resonator devices are separated from the remainder of the wafer 502 at 560). Again, two resonator devices 542 and 544 are depicted in FIG. 5, however, it is to be appreciated that substantially any number of resonator devices can be cut from the wafer 502. The density of the voids 512 and the voids 524 in the wafer 502 is such that locations at which the resonator devices are cut from the wafer 502 need not be precisely controlled. For instance, a probability of at least one of the voids 512 being at or near a perimeter of a resonator device is above the threshold and a probability of at least one of the voids 524 being at or near the perimeter of the resonator device is above the threshold regardless where the wafer 502 is cut to form such resonator device.

Again, as noted above, additional fabrication steps can be performed on the wafer 502 subsequent to ion implantation and prior to the resonator devices being cut. Additionally, it is contemplated that the resonator devices cut from the wafer 502 can be disk shaped (with or without chamfered edges), asymmetric disk shaped, ring shaped, or the like. Further, additional fabrication steps can be performed on the resonator devices 542 and 544 subsequent to cutting. Moreover, resonator devices manufactured employing the foregoing approach can support fundamental modes (e.g., located in the midplane 508), while suppressing side modes by including the voids at depths from the top surface 504 and the bottom surface 506. Performance of ion implantation to generate the voids 512 and the voids 524 in the wafer 502 prior to cutting the resonator devices from the wafer 502 enables defects to be created for the resonator devices in a parallel manner, which aides mass production of whispering gallery mode resonator devices with localized voids to suppress side modes.

Figure 6:
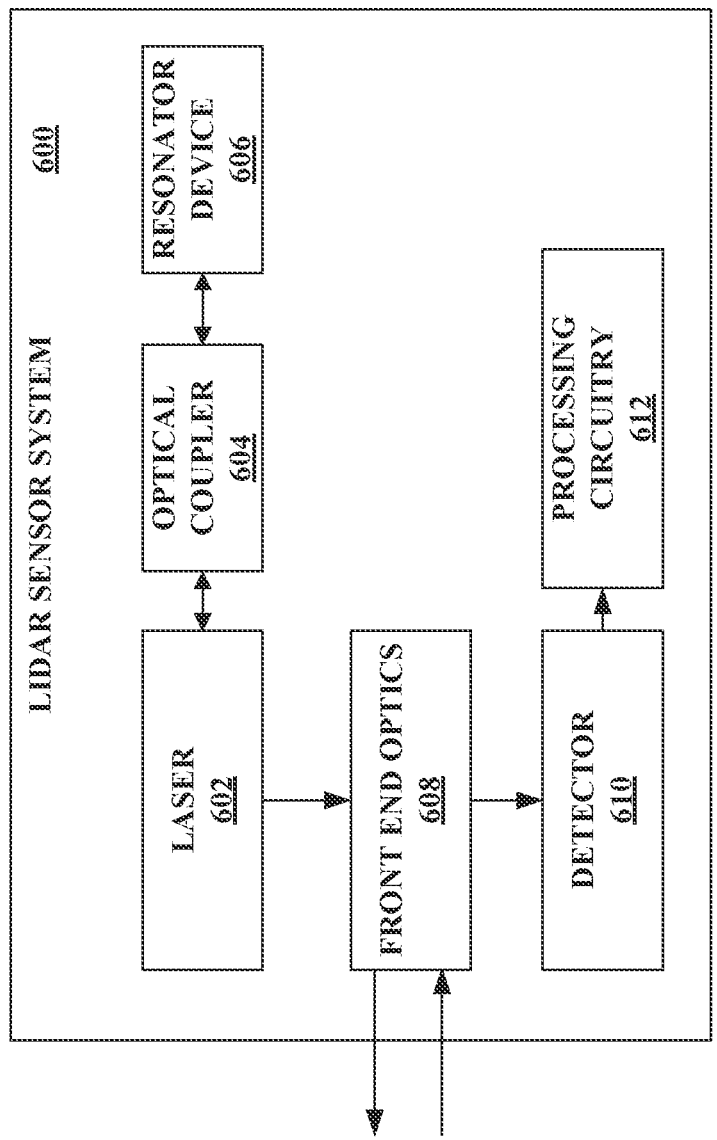
FIG. 6 illustrates a block diagram of an exemplary lidar sensor system.

With reference to FIG. 6, illustrated is an exemplary lidar sensor system 600. The lidar sensor system 600 can be a frequency modulated continuous wave (FMCW) lidar sensor system; however, the claimed subject matter is not so limited. The lidar sensor system 600 includes a laser 602, an optical coupler 604, and a resonator device 606. The optical coupler 604 is coupled to the laser 602, and the resonator device 606 is coupled to the optical coupler 604. The resonator device 606 can be the whispering gallery mode resonator device 100 of FIG. 1, the whispering gallery mode resonator device 200 of FIG. 2, or the like.

The laser 602 can be a semiconductor laser, a laser diode, or the like. The optical coupler 604 can be configured to couple light outputted by the laser 602 to the resonator device 606. Further, the optical coupler 604 can be configured to couple light returning from the resonator device 606 to the laser 602.

As described herein, the resonator device 606 can include electrodes to which a voltage can be applied. Application of a voltage to the resonator device 606 can change an optical property of the electrooptic material of the resonator device 606. For instance, application of a voltage can change an index of refraction of the electrooptic material of the resonator device 606.

The laser 602 is optically injection locked to the resonator device 606. The laser 602 can be injection locked to a fundamental mode of the resonator device 606. Further, side mode(s) can be suppressed as described herein. Moreover, since the laser 602 is optically injection locked to the resonator device 606, a voltage applied to the resonator device 606 can impart a frequency change on the laser 602.

The lidar sensor system 600 further includes front end optics 608 configured to transmit, into an environment of the lidar sensor system 600, at least a portion of an optical signal generated by the laser 602. According to various examples, the front end optics 608 can include a scanner, which can direct the optical signal over a field of view in the environment. The front end optics 608 can also include other optical elements, such as one or more lenses, an optical isolator, one or more waveguides, an optical amplifier, an interferometer, and so forth. Such optical elements can enable generating the optical signal with desired properties such as collimation, divergence angle, linewidth, power, and the like. Such optical elements may be assembled discretely, or integrated on a chip, or in a combination of both. The front end optics 608 can also be configured to receive a reflected optical signal from the environment. The reflected optical signal can correspond to at least a part of the optical signal transmitted into the environment that reflected off an object in the environment.

Moreover, the lidar sensor system 600 can include a detector 610 (e.g., a photodetector) and processing circuitry 612. The detector 610 can be configured to mix the reflected optical signal received by the front end optics 608 with a local oscillator portion of the optical signal generated by the laser 602. The processing circuitry 612 can be configured to compute distance and velocity data of the object in the environment based on output of the detector 610.

Figure 7:
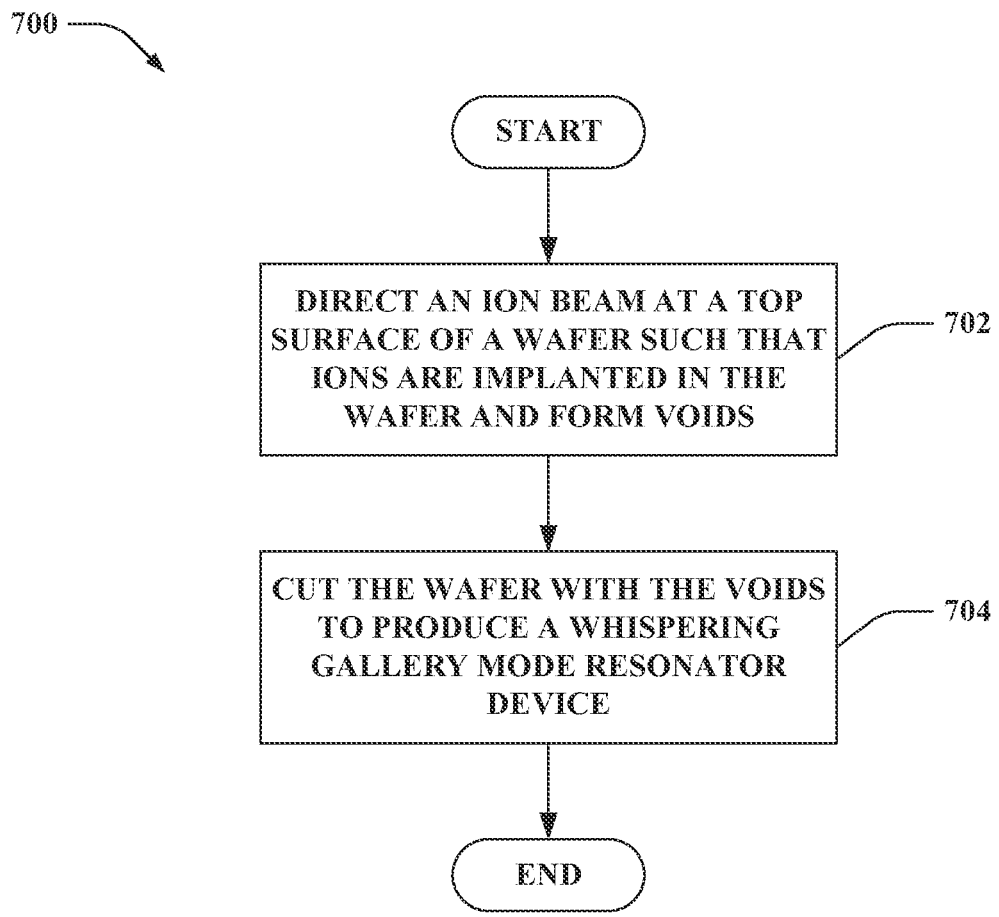
FIG. 7 is a flow diagram that illustrates an exemplary methodology of manufacturing a whispering gallery mode resonator device.

FIG. 7 illustrates an exemplary methodology related to manufacturing whispering gallery mode resonator devices described herein. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement the methodology described herein.

FIG. 7 illustrates a methodology 700 of manufacturing a whispering gallery mode resonator device. At 702, an ion beam can be directed at a top surface of a wafer formed of an electrooptic material. Ions in the ion beam are implanted in the wafer and form voids distributed at a particular depth from the top surface in the wafer by directing the ion beam at the top surface of the wafer. Implantation energy and ion current density of the ion beam can be tuned to control a density of the voids formed at the particular depth from the top surface (e.g., the depth can be a function of the implantation energy, the density of the voids can be a function of the ion current density). According to an example, the ion beam can also be directed at a bottom surface of the wafer; following this example, ions in the ion beam are implanted in the wafer and form voids distributed at a particular depth from the bottom surface in the wafer by directing the ion beam at the bottom surface of the wafer. Additionally or alternatively, the ion beam can further be directed at the top surface of the wafer such that ions in the ion beam are implanted in the wafer and form voids distributed at a differing depth from the top surface of the wafer. At 704, the wafer with the voids distributed at the particular depth from the top surface (as well as other voids formed therein) can be cut to produce at least the whispering gallery mode resonator device. It is contemplated that substantially any number of whispering gallery mode resonator devices can be cut from the wafer. According to an example, the whispering gallery mode resonator device can be disk shaped (with or without chamfered edges), ring shaped, or the like.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A resonator device, comprising:
a whispering gallery mode resonator formed of an electrooptic material, the whispering gallery mode resonator comprising:
   a top surface;
   a bottom surface substantially parallel to the top surface;
   a side structure between the top surface and the bottom surface, the side structure comprises an axial surface along a perimeter of the whispering gallery mode resonator, wherein a midplane passes through the axial surface dividing the axial surface into symmetrical halves; and
   voids localized within a particular depth range from the top surface, the particular depth range from the top surface being between the top surface and the midplane, the voids being bubbles formed within the electrooptic material, wherein at least one of the voids localized within the particular depth range from the top surface is located at an outer extremity towards the perimeter of the whispering gallery mode resonator;
a first electrode on the top surface of the whispering gallery mode resonator; and
a second electrode on the bottom surface of the whispering gallery mode resonator.

2. The resonator device of claim 1, wherein the whispering gallery mode resonator is disk shaped.

3. The resonator device of claim 1, wherein the whispering gallery mode resonator is ring shaped.

4. The resonator device of claim 1, wherein the whispering gallery mode resonator lacks voids between the bottom surface and the midplane.

5. The resonator device of claim 1, wherein the side structure is a convex side structure.

6. The resonator device of claim 1, the whispering gallery mode resonator further comprises:
voids localized within a particular depth range from the bottom surface, the particular depth range from the bottom surface being between the bottom surface and the midplane, the voids being bubbles formed within the electrooptic material, wherein at least one of the voids localized within the particular depth range from the bottom surface is located at an outer extremity towards the perimeter of the whispering gallery mode resonator.

7. The resonator device of claim 1, the whispering gallery mode resonator further comprises:
voids localized within a differing particular depth range from the top surface, the differing particular depth range from the top surface being between the top surface and the midplane, the voids being bubbles formed within the electrooptic material, wherein at least one of the voids localized within the differing particular depth range from the top surface is located at an outer extremity towards the perimeter of the whispering gallery mode resonator.

8. The resonator device of claim 1, the side structure of the whispering gallery mode resonator disk further comprises:
a first chamfered edge between the top surface and the axial surface; and
a second chamfered edge between the bottom surface and the axial surface.

9. The resonator device of claim 1, wherein the resonator device supports a fundamental mode located in the midplane.

10. The resonator device of claim 1, wherein the particular depth range from the top surface is a range between 10 micrometers and 20 micrometers from the top surface.

11. The resonator device of claim 1, wherein the voids localized within the particular depth range from the top surface are ion-implanted voids located within the electrooptic material within the particular depth range from the top surface.

12. The resonator device of claim 1, wherein the voids are distributed across the whispering gallery mode resonator within the particular depth range from the top surface.

13. A lidar sensor system, comprising:
a laser;
an optical coupler that is coupled to the laser; and
a whispering gallery mode resonator that is coupled to the optical coupler, the whispering gallery mode resonator formed of an electrooptic material, the whispering gallery mode resonator comprising:
   a top surface;
   a bottom surface;
   a side structure between the top surface and the bottom surface, the side structure comprises an axial surface along a perimeter of the whispering gallery mode resonator, wherein a midplane passes through the axial surface dividing the axial surface into symmetrical halves; and
   voids localized within a particular depth range from the top surface, the particular depth range from the top surface being between the top surface and the midplane, the voids being bubbles formed within the electrooptic material, wherein at least one of the voids localized within the particular depth range from the top surface is located at an outer extremity towards the perimeter of the whispering gallery mode resonator.

14. The lidar sensor system of claim 13, wherein the bottom surface of the whispering gallery mode resonator is substantially parallel to the top surface of the whispering gallery mode resonator.

15. The lidar sensor system of claim 13, further comprising:
   a first electrode on the top surface of the whispering gallery mode resonator; and
   a second electrode on the bottom surface of the whispering gallery mode resonator.

16. The lidar sensor system of claim 13, wherein the whispering gallery mode resonator is ring shaped.

17. The lidar sensor system of claim 13, wherein the whispering gallery mode resonator is disk shaped.

18. The lidar sensor system of claim 13, wherein the whispering gallery mode resonator lacks voids between the bottom surface and the midplane.

19. A method of manufacturing a whispering gallery mode resonator, comprising:
   directing an ion beam at a top surface of a wafer formed of an electrooptic material such that ions in the ion beam are implanted in the wafer and form voids distributed across the wafer within a particular depth range from the top surface of the wafer, the voids being bubbles formed within the electrooptic material; and
   cutting the wafer with the voids distributed across the wafer within the particular depth range from the top surface to produce at least the whispering gallery mode resonator.

20. The method of claim 19, further comprising:
   directing the ion beam at a bottom surface of the wafer such that ions in the ion beam are implanted in the wafer and form voids distributed across the wafer within a particular depth range from the bottom surface of the wafer, wherein the wafer with the voids distributed within the particular depth range from the top surface and the voids distributed within the particular depth range from the bottom surface is cut to produce at least the whispering gallery mode resonator.

* * * * *